United States Patent [19]

Johns et al.

[11] 4,328,264
[45] May 4, 1982

[54] METHOD FOR MAKING APPARATUS FOR TESTING TRACES ON A PRINTED CIRCUIT BOARD SUBSTRATE

[75] Inventors: William E. Johns, Sunnyvale; David E. Locklin, Danville, both of Calif.

[73] Assignee: Printed Circuits International, Inc., Sunnyvale, Calif.

[21] Appl. No.: 102,042

[22] Filed: Dec. 10, 1979

[51] Int. Cl.³ .......................... H05K 3/42; H01R 9/09
[52] U.S. Cl. ..................................... 427/97; 174/68.5; 324/158 P; 427/96
[58] Field of Search ............................ 427/96, 97, 98; 174/68.5; 324/158 P; 29/829, 846, 852

[56] References Cited

U.S. PATENT DOCUMENTS

| | | | |
|---|---|---|---|
| 3,803,709 | 4/1974 | Beltz et al. | 324/158 P |
| 4,061,969 | 12/1977 | Dean | 324/158 P |
| 4,164,704 | 8/1979 | Kato | 324/158 P |

*Primary Examiner*—Ralph S. Kendall
*Attorney, Agent, or Firm*—Townsend and Townsend

[57] ABSTRACT

Method and apparatus to test continuity of miniature printed circuit board traces prior to installation of components. A short circuits probe and an open circuits probe are each provided which are specific to the pattern of traces to be tested. The probes are constructed by adapting a mirror image of the traces to be tested as probe contact points and registering the adapted mirror image as plating on a second circuit board substrate. Interconnections between contact points are typically provided on the back side of the second substrate. The interconnections couple the contact points with a continuity indicator. The circuit pattern specific probes according to the invention are employed by aligning the contact points with the circuit board traces to be tested and then effecting contact therebetween. The plating forming the contact points is of sufficient uniformity and elevation to provide desired clearance between adjacent traces. Short circuits are identified by indicated continuity between a test of traces, typically adjacent traces, where no contact should exist, and open circuits are identified by lack of indicated continuity through tested traces. The probes are typically employed in "go, no-go" testing protocols of miniature circuit boards in a mass production environment. In particular, the probes are most useful in testing circuit board traces where intertrace spacing is less than about 0.5 millimeter and is typically as small as about 0.02 millimeter. The invention eliminates the need for primary visual inspection, which in the case of miniature circuit boards is tedious and unreliable.

8 Claims, 8 Drawing Figures

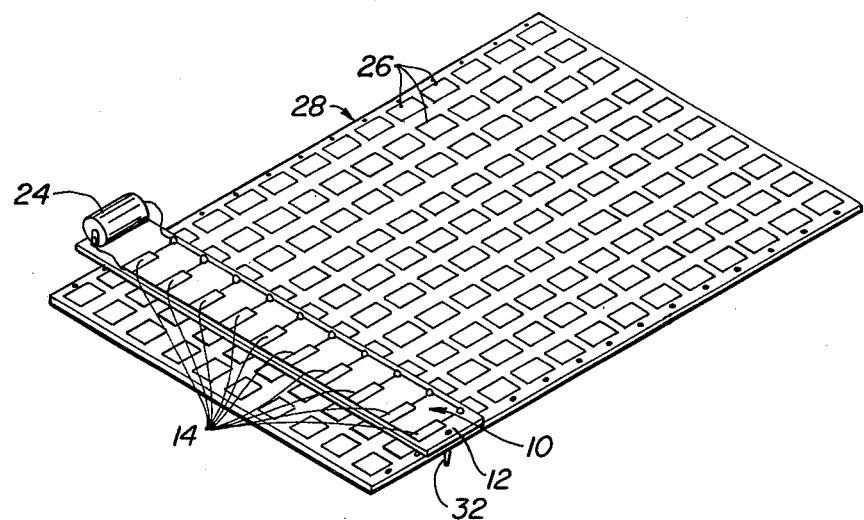
FIG._1.
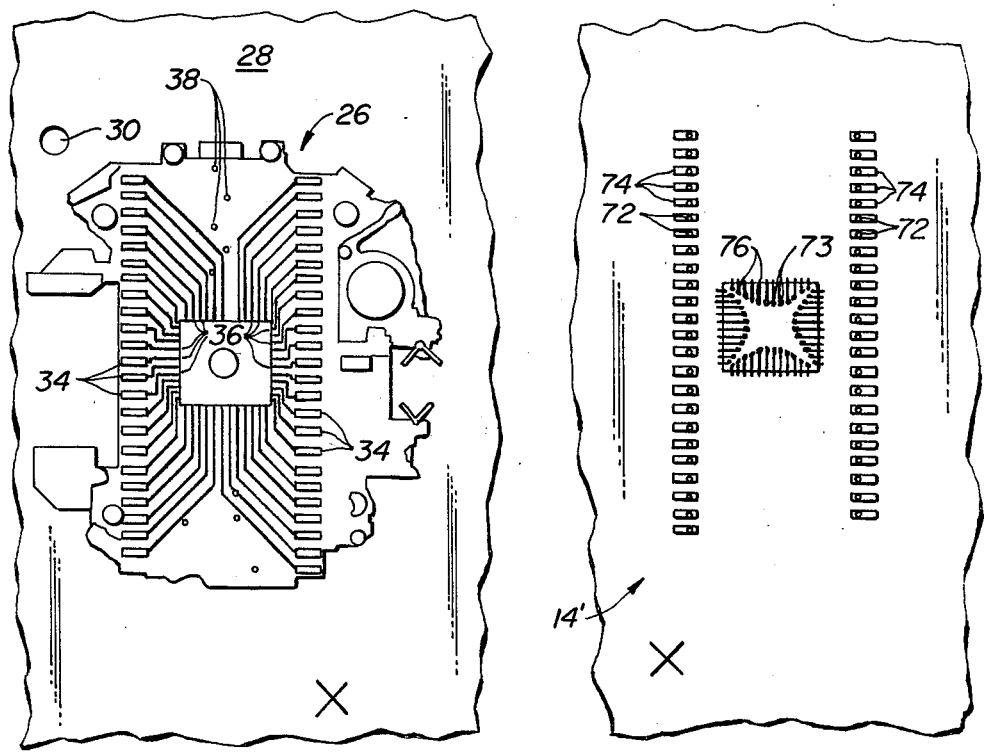
FIG._2.   FIG._5.

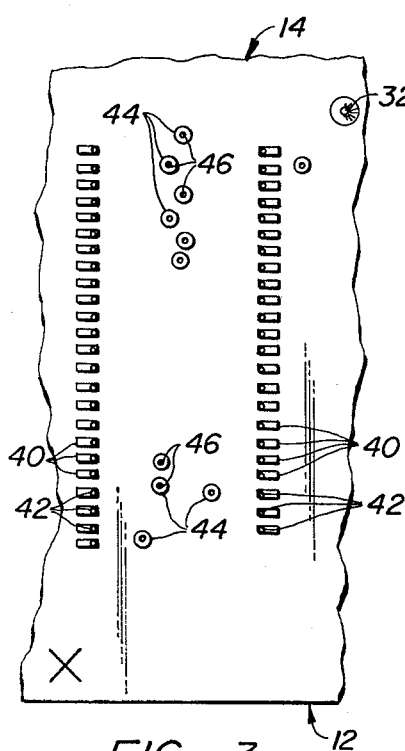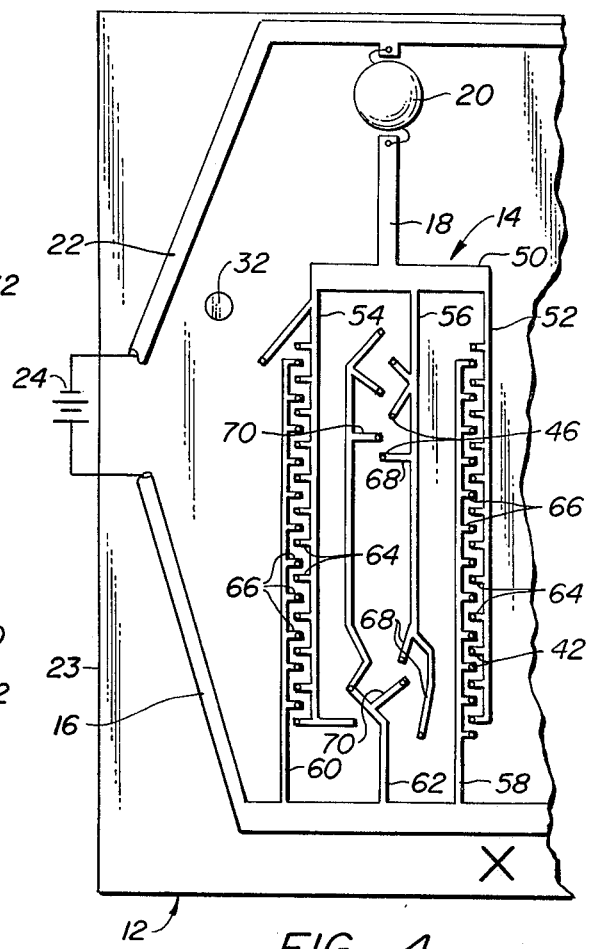

U.S. Patent  May 4, 1982  Sheet 3 of 3  4,328,264
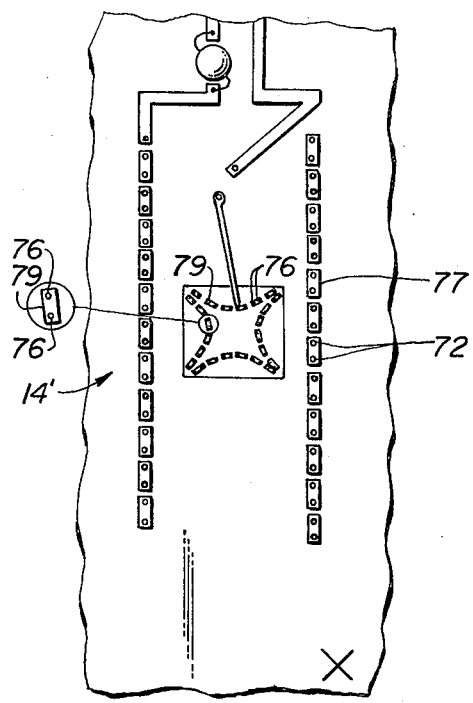
FIG._6.
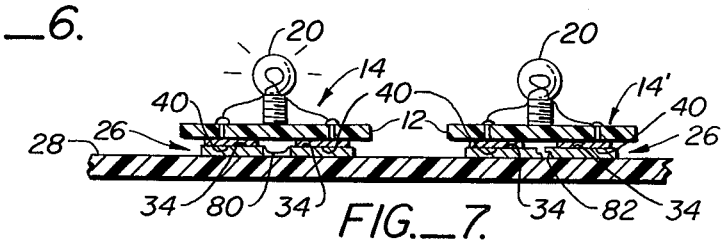
FIG._7.
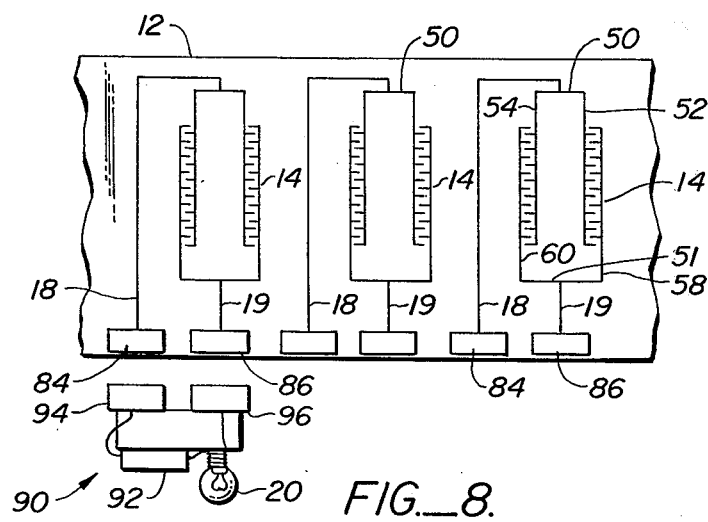
FIG._8.

METHOD FOR MAKING APPARATUS FOR TESTING TRACES ON A PRINTED CIRCUIT BOARD SUBSTRATE

BACKGROUND OF THE INVENTION

1. Field of the Invention

This invention relates to a trace continuity tester for bare printed circuit boards, particularly unseparated miniature circuit boards having trace separation of less than about 0.5 millimeter. Specifically, the invention relates to a probe which is specific to the circuit boards to be tested and a method for constructing such a probe.

The construction or printed circuit boards according to conventional photoresist and electroplating processes wherein a conductive plating of copper, nickel, silver or gold is registered on a glass impregnated epoxy substrate is subject to manufacturing effects. Typical manufacturing effects are undesired short circuits between adjacent traces and broken traces giving rise to open circuits. Considerable time and effort is required to locate and eliminate circuits having trace defects.

The two principal methods for locating circuits with trace defects are visual inspection and electrical continuity inspection. In visual inspection, a worker examines each trace of each circuit visually, and possibly under a microscope or lupe, if the circuit is miniature (that is, if the spacing amoung traces is less than can be readily resolved with the unaided eye). Visual inspection is tedious and frequently unreliable, since circuit defects can easily be overlooked.

In the second method most often used, electrical circuitry is tested by mechanically contacting selected test points of the unit under test and electrically transmitting continuity information to an analyzer to determine if there are errors indicative of trace defects. In the past, elevated probe contacts mounted to a general purpose support frame have been employed. One type of probe contact array is the so-called "bed of nails" in which rigid pins are mounted to a board at selected locations corresponding to test points on the circuit board to be tested. Another type of probe contact is the spring-loaded probe contact wherein each terminal comprises a barrel, a spring and a contact plunger mounted to a socket or other support in an array similar to a "bed of nails". The "bed of nails" requires careful plane alignment to assure proper electromechanical contact between the individual pins and the test points. Spring-loaded probe contacts partially overcome this deficiency by compensating for irregularities in the surface of the device to be tested.

There is nevertheless a physical limitation on the minimum size of the contact head and the minimum center to center spacing between contact heads. Typically, a probe contact can be spaced no closer than about 0.7 millimeter center to center. Probes having smaller contacts for lesser diameter spacing are extremely fragile and unreliable. Accordingly, what is needed is a probe capable of use with miniature printed circuit boards.

2. Brief Description of the Prior Art

The following companies are representative of those which provide trace analyzer devices employing the spring-loaded or "bed of nails" type contact probes: Trace Instruments of Canoga Park, Calif.; Program Data, Inc. of Irvine, Calif.; Pylon Company, Inc. of Attleboro, Mass.; Fault Finders, Inc. of Irvine Calif.; Everett/Charles, Inc. of Pomona, Calif.; and ATEC Assembly and Test Equipment Corporation of Pomona, Calif.

SUMMARY OF THE INVENTION

According to the invention, a probe is provided which is specific to the printed circuit pattern to be tested. A probe for testing for continuity of traces on a bare printed circuit board is constructed on a printed circuit board substrate as a pattern of plating which forms probe contacts. A mirror image of the traces to be tested is adapted to define selected regions of probe contact thereof. The selected regions are registered as conductive traces on one side of a printed circuit board substrate and interconnections are made on the opposing side of the substrate in a preselected circuit for connecting to a continuity tester, such as a series-coupled lamp and power supply of an ohmeter. A continuity indication is generated upon aligned contact between the probe according to the invention and the circuit pattern to be tested. The interconnections are preferably conductive traces registered on the back side of the probe substrate, with plated-through connections to the probe contacts.

Two types of probes may be provided, namely, a short circuits probe and an open circuits probe. In the short circuits probe, where it is desired to test for short circuits or excess trace material between adjacent traces, the interconnections provide electrical coupling between adjacent traces and opposing poles of the continuity detector. For an open circuits detector where it is desired to test for discontinuities in circuit traces, the interconnections provide series bridge connections through all traces and through all points of contact between the probe contacts and the traces of the specific circuit board trace pattern to be tested. The probe according to the invention is employed by aligning the probe contacts with the traces to be tested, typically before the substrate is subdivided into individual circuit boards. In this manner, a plurality of circuits can be tested simultaneously. Short circuits are indicated by continuity through the short circuit probe and open circuits are indicated by a lack of continuity through the open circuit probe.

The probes according to the invention are normally constructed in connection with the initial processing and construction of printed circuit boards in a printed circuit board shop. The art work used in the initial processing is employed to make a mirror image trace pattern on a substrate, omitting unnecessary traces from the art work thereby to define the selected regions of probe contact. The probe may be employed with a single printed circuit board unit, a segment of a printed circuit board unit, or a row of printed circuit board units undivided from its stock substrate. As a further alternative, a probe can be constructed which is essentially a mirror image of the entire stock printed circuit board.

The present invention is particularly well adapted to the testing of a substrate wherein the separation among traces is smaller than can be accommodated by more conventional elevated pin-type probes, such as the "bed of nails" and the spring-loaded contact pins. However, the concept of the invention can be applied to test any planar circuit board pattern wherein the conductive traces are elevated sufficiently to unambiguously abut to elevated traces or contact regions on the substrate surface of a probe.

Other objects and advantages of the invention will be apparent upon reference to the following detailed description in connection with the accompanying drawings.

BRIEF DESCRIPTION OF THE DRAWINGS

FIG. 1 is a perspective view of the tester with a probe according to the invention aligned on a substrate having a plurality of circuits to be tested.

FIG. 2 is an example of a substrate to be tested.

FIG. 3 is one unit on a first side of a probe substrate illustrating probe contacts.

FIG. 4 is the opposite side of the substrate of FIG. 3 showing interconnections for a shorts tester.

FIG. 5 is a side of a substrate for a second type of probe.

FIG. 6 is a view of the opposite side of the probe of FIG. 5 showing the interconnections for an open circuits tester.

FIG. 7 is a side cross-sectional view of a probe and a substrate.

FIG. 8 is an alternative embodiment of the probe according to the invention wherein external terminals are provided for each unit or segment of the probe.

DETAILED DESCRIPTION OF PREFERRED EMBODIMENTS

For convenience, all like numerals refer to like elements of the several figures. Referring primarily to FIG. 1, there is shown one embodiment of a tester 10 according to the invention. The tester 10 comprises a printed circuit board strip 12 having a row of identical probes 14 formed of conductive material plated on the strip 12. To each probe 14 there is coupled a first bus 16 and a first conductor 18 (FIG. 4). Each first conductor 18 is connected in series to an indicator lamp 20 mounted on the strip 12. The indicator lamp 20 is coupled to a second bus 22. First bus 16 and second bus 22 extend from each probe 14 to one edge 23. The power source 24 is connected between the first bus 16 and second bus 22 at the edge 23. The power source 24 may be a simple battery cell mounted on the edge 23.

The probes 14 on the strip 12 are intended to align with a row of trace patterns to be tested, or traces to be tested (TUTs) 26 on a large substrate 28 (FIG. 1). For this purpose, the substrate 28 is provided with alignment holes 30 (FIGS. 1 and 2) preferably one alignment hole on each edge of each row of TUTs 26. The strip 12 includes alignment pins 32 (FIGS. 1, 3 and 4) at the edges corresponding to the alignment holes 30 (FIG. 2).

FIG. 2 shows a detail of a typical TUT 26, which is not a part of the invention. The TUT 26 is considerably enlarged in size in comparison with actual size. The TUT 26 comprises a plurality of conductive traces, typically of gold plated copper bonded to the underlying substrate 28. The TUT 26 has edge bonding pads 34 along the periphery of the pattern and center bonding pads 36 interior to the pattern adjacent areas to which hybrid circuit chips (not shown) are to be subsequently die attached. The spacing between the edge bonding pads 34 is about one-half millimeter. Spacing between adjacent center bonding pads 36 is on the order of 0.02 millimeter. In addition, there are selected test points 38 in and around the trace pattern of the TUT 26.

FIG. 3 illustrates the contacts 40 of a probe 14 specific to the circuit of FIG. 3. The contacts 40 align with the edge bonding pads 34 (FIG. 2) in mirror image. Contacts 40 comprise areas of plating on the strip 12.

Each contact 40 has a hole 42 through the strip 12 which is plated through to the opposite side. Additional contacts 44 align with other portions of the TUT 26 for test points 38 and other miscellaneous conductive traces of the TUT 26. Additional holes 46 are also provided through additional contacts 44 which are plated through to the opposing side.

Referring to FIG. 4, there is shown interconnections for a shorts-type tester probe 14 according to the invention. The holes 42 are disposed in a single line on each side of the probe 14 in alignment with the contacts 40. Extending from the first conductor 18 is a conductor trace 50 from which extend first, second and third branches 52, 54 and 56. Fourth, fifth and sixth branches 58, 60 and 62 extend from the first bus 16 generally in parallel to the first, second and third branches 52, 54 and 56. First branch 52 is paired with fourth branch 58, second branch 54 is paired with fifth branch 60 and third branch 56 is paired with sixth branch 62. Fingers 64 extend from first and second branches 52, 54 in one direction to terminate at alternating holes 42. Fingers 66 extend from fourth and fifth branches 58 and 60 in a direction opposing fingers 64 to terminate at the alternate holes 42 such that the fingers 64 and 66 interleave one another on the surface of strip 12. Fingers 68 extend from third branch 56 to the additional holes 46, and fingers 70 extend from branch 62 to alternate additional holes 46. In this manner, the contacts 40 and additional contacts 44 are connected to fingers and branches on the opposing side of strip 12 such that connections from contacts 40 and additional contacts 44 to the conductive paths of the circuit specific to the contact pattern of FIG. 3, such as the TUT 26 of FIG. 2, can be tested for undesired continuity with adjacent traces of the TUT 26 (FIG. 2). If continuity exists between adjacent traces, it indicates a defective trace pattern on the circuit. Accordingly, the lamp 20 provides the continuity indication whenever a short circuit is present.

The shorts circuits tester 10 is typically all that is required since the most frequent fault is a short circuit between adjacent traces. However, it is also possible to provide an open circuits tester according to the invention. Reference is made to FIG. 5 where the contact pattern for an open circuits tester probe 14' is shown. As in the probe 14 of FIG. 3, plated-through holes 42 are provided at each contact pad 40. In addition, plated-through holes 72 are provided for contact pads 74 at the position on the strip 12 corresponding to the outer end of each trace, to which pads 40 thereof are intended to contact, and plated-through holes 76 are provided corresponding to the inner end, to which pads 79 are intended to contact.

FIG. 6 shows the interconnection pattern for a series connected open circuits tester according to the invention. The interconnection pattern is a set of traces 77 between adjacent plated-through holes 72 alternating with traces 79 between plated-through holes 76. A single series circuit is defined through the indicator lamp 20 when the probe 14' is abutted in exact alignment to its specific circuit, for example as shown in FIG. 2. A defect is identified by a lack of a continuity indication.

FIG. 7 depicts in cross-section the application of a probe 14 or a shorts circuits tester and a probe 14' for an open circuits tester. The bonding pads 34 of the TUT 26 are of sufficient thickness that the surfaces are elevated with respect to the substrate. Similarly, the contacts 40 of the probes 14 and 14' are of sufficient thickness such that the surface of the contacts 40 are elevated with respect to the strip 12. Accordingly, correctly aligned contacts 40 and pads 34 can abut in electrical contact to one another. A short circuit 80 is identified by a continuity indication of the probe 14. Similarly, a broken or open trace 82 is identified by a lack of continuity indication in a series circuit through open circuit probe 14'.

There is generally a degree of flexure in the strip 12 which allows compensation for minor irregularities in the level of the traces in the TUT 26. By simply applying pressure contact between the probe 14 and the TUT 26, the probe 14 generally warps sufficiently to make good electrical contact with conductive surfaces properly aligned with the contacts 40.

Of course, it is important that the surfaces of the TUT 26 confronting the probe 14 be essentially free of contamination. Otherwise, good electrical contact may not be established.

FIG. 8 illustrates a further preferred embodiment of the invention comprising a strip 12 with a plurality of probes 14 plated thereon. Each probe 14 comprises a first conductor 18 coupled between a first trace 50 and a contact pad 84 along a long edge of the strip 12. Further, the probe 14 includes a second conductor 19 coupled between a second trace 51 and a second test pad 86 adjacent the first pad 84 along a long edge of the strip 12. First branches 52 and 54 extend from trace 50, and second branches 58 and 60 extend from second trace 51 in a back side pattern essentially the same as the probe 14 of FIG. 4.

Importantly, the entire probe 14 is formed by conventional printed circuit board plating techniques. No component need be permanently mounted to the circuit board. Instead, a continuity checker 90, consisting of a battery 92 and a lamp 20 coupled in series between conductive probes 94 and 96 may be provided for use in connection with the probe 14. The continuity probes 94 and 96 are connected to the pads 84 and 86 of the probe 14 then in use. The continuity contacts 94 and 96 may be spaced a fixed distance from one another and disposed to directly confront the test pads 84 and 86. In this configuration, a single continuity checker 90 can be used to manually scan a plurality of probes 14 mounted and aligned to a plurality of TUTs 26. As a still further possible alternative embodiment, the test pads 84 and 86 can be omitted. The traces 50 and 51 can then be used as contact locations for the continuity contacts 94 and 96, such that the continuity checker 90 through the probes 94 and 96 is the instrument applying pressure between the probe 14 and the underlying aligned TUT 26 (not shown).

The construction of a probe 14 according to the invention for use with the continuity tester is of particular interest. The key to construction is proper alignment of the TUT 26 with the contacts 40 of the probe 14. For this purpose, the probe 14 is constructed by first adapting an image of a pattern of traces to be tested or a TUT 26 in a manner to define selected regions of probe contact to be registered on a circuit board substrate. Then the image so adapted is registered on the substrate as conductive plating. Finally, the conductive plating is interconnected in a preselected pattern on the opposite face of the substrate for coupling to a continuity testing means such that a continuity indication can be provided upon aligned contact between traces of the TUT 26 and the conductive plating registered on the substrate.

Typically, the pattern image adapting step comprises providing a mirror image of the pattern or traces to be tested, and specifically it comprises generating a spatially undistorted mirror image copy of the art work which is employed to register the conductive image of the traces to be tested on the circuit board substrate. In a further refinement, selected regions of indicated plating on the copy of the art work are eliminated except in those areas corresponding to the edge bonding pads and center bonding pads and any additional test points of the circuit traces.

While interconnecting can in theory be effected by hand wiring the back side of the probe 14, the preferred method of interconnecting is to register conductive traces in the conventional printing manner on the opposite of the substrate forming the strip 12 and then coupling with plated through holes to the contacts 40. Specifically, in order to provide a short circuit probe, this coupling step comprises connecting a first electrical contact location corresponding to a first trace to be tested through the substrate to a first external terminal and connecting a second contact location corresponding to a second trace to be tested, which second trace runs adjacent to a first trace on the device to be tested, through the substrate to a second external terminal. Undesired continuity between the two traces can be determined by checking continuity between the two external terminals when the probe is abutted in alignment to the device to be tested.

The method for constructing a probe for testing for open circuits differs somewhat in that coupling comprises connecting a first contact location corresponding to a first end of a trace to be tested through the substrate to a first external terminal and coupling a second contact location corresponding to a second end of a trace to be tested through the substrate to a second external terminal.

In conclusion, this invention provides a new apparatus for testing circuit board traces before external components are mounted thereto. The apparatus is specific to the circuit boards to be tested, and is constructed according to a technique utilizing the same material and methods used in the construction of the circuit board to be tested. For example, to construct the probe 14 according to the invention, a worker simply makes a negative mirror image of the pattern to be tested, erases unwanted portions of the tracing and adds new contact locations, prepares the image so prepared as a photo mask, prepares a second photo mask for the back side of the substrate defining interconnections between the conductive plating locations already defined by the first photo mask, drills a substrate with appropriately located holes corresponding to interconnections through the substrate, and then registers the two newly prepared images in alignment on opposing sides of a circuit board substrate. Thereafter, alignment pins and continuity indicators, if needed, are mounted to the substrate to provide a finished probe.

The invention has now been explained with reference to specific embodiments. Further embodiments will be suggested to those of ordinary skill in the art in view of this disclosure. It is therefore not intended that this invention be limited, except as indicated by the appended claims suggested by a reasonable interpretation of the specification.

What is claimed is:

1. A method for constructing a probe for a continuity test means for testing traces on a first planar printed circuit board substrate, said method comprising the steps of:

providing a mirror image of a pattern of said traces to be tested to define selected regions of probe contact on a second substrate;

registering said image as conductive plating on an obverse face of said second substrate; and interconnecting said conductive plating in a preselected pattern on a reverse face of said second substrate for coupling to said continuity testing means such that a continuity indication is provided upon aligned contact between said traces to be tested and said conductive plating.

2. The method as defined in claim 1 wherein said image providing step comprises generating a spatially undistorted mirror image copy of art work employed to register said traces to be tested.

3. The method as defined in claim 2 wherein said image providing step further comprises eliminating regions of indicated plating on said copy except in areas corresponding to selected positions along said traces to be tested.

4. The method as defined in claim 3 wherein said regions indicated plating correspond to ends of said traces to be tested.

5. The method as defined in claim 1 wherein said interconnecting step comprises registering conductive traces on the side of said second substrate opposing said conductive plating and providing connections between said traces and said conductive plating.

6. A method for constructing a probe of a continuity tester for a pattern of traces to be tested on a first planar printed circuit board substrate, said method comprising the steps of:

providing a mirror image of said traces to be tested as a first trace pattern;

eliminating selected regions of said first trace pattern to define electrically conductive probe locations to abut to selected electrically conductive locations of said traces to be tested;

providing a second trace pattern for defining a pattern of traces for interconnecting said conductive probe locations;

registering said first trace pattern as a first plating of conductive material on a first side of a second planar printed circuit board substrate;

registering said second trace pattern as a second plating of conductive material on a second side of said second planar printed circuit board substrate, said second side opposing said first side;

electrically coupling said first plating to said second plating at selected locations; and providing externally accessible electrical terminals to said second plating.

7. The method as defined in claim 6 wherein said coupling step comprises connecting a first electrical probe location corresponding to a first trace to be tested through said second plating to a first one of said external terminals and connecting a second probe location corresponding to a second trace to be tested adjacent to said first trace to be tested through said second plating to a second one of said external terminals such that a positive continuity indication is provided upon aligned contact between such traces to be tested and said probe locations in the event of a short circuit between said traces to be tested.

8. The method as defined in claim 7 wherein said coupling step comprises connecting a first probe location corresponding to a first end of a trace to be tested through said second plating to a first of said external terminals;

coupling a second probe location corresponding to a second end of said trace to be tested through said second plating to a second one of said external terminals such that a negative continuity indication is provided upon aligned contact between said probe locations and said trace to be tested in the event of an open circuit.

* * * * *